(12) United States Patent
Lee

(10) Patent No.: US 6,859,901 B2
(45) Date of Patent: Feb. 22, 2005

(54) METHOD FOR TESTING MEMORIES WITH SEAMLESS DATA INPUT/OUTPUT BY INTERLEAVING SEAMLESS BANK COMMANDS

(75) Inventor: Chen-Tsai Lee, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 555 days.

(21) Appl. No.: 09/886,341

(22) Filed: Jun. 21, 2001

(65) Prior Publication Data

US 2002/0083383 A1 Jun. 27, 2002

(30) Foreign Application Priority Data

Dec. 27, 2000 (TW) .................................. 89127914 A

(51) Int. Cl.[7] .............................................. G11C 29/00
(52) U.S. Cl. ....................................... 714/718; 365/201
(58) Field of Search ........................... 714/718; 365/201

(56) References Cited

U.S. PATENT DOCUMENTS 4,507,730 A * 3/1985 Johnson et al. ............. 711/170
5,195,097 A * 3/1993 Bogholtz et al. ............ 714/743
5,428,626 A * 6/1995 Frisch et al. ................ 714/744
5,636,173 A * 6/1997 Schaefer ................. 365/230.03
6,067,255 A * 5/2000 Jung et al. ............... 365/189.02
6,226,755 B1 * 5/2001 Reeves ....................... 713/400

* cited by examiner

Primary Examiner—Guy J Lamarre
Assistant Examiner—Cynthia Britt
(74) Attorney, Agent, or Firm—Jackson Walker LLP

(57) ABSTRACT

A method for testing memories has steps of providing seamless data to data input/output pins and providing seamless control commands to each bank at each clock cycle, when the memories receive the seamless data and control commands, and the data input/output pins of memories receive heavy loads status. For SDRAM and DDR-DRAM, control commands and data are seamlessly inputted/outputted at each clock cycle. For RDRAM, control commands are inputted at each "command packet", whereby data are inputted/outputted at each "data packet" and memories are in the heavy loading status. By providing heavy loading to control pins and data input/output pins of memories, it is easy to detect weakened memories.

6 Claims, 24 Drawing Sheets

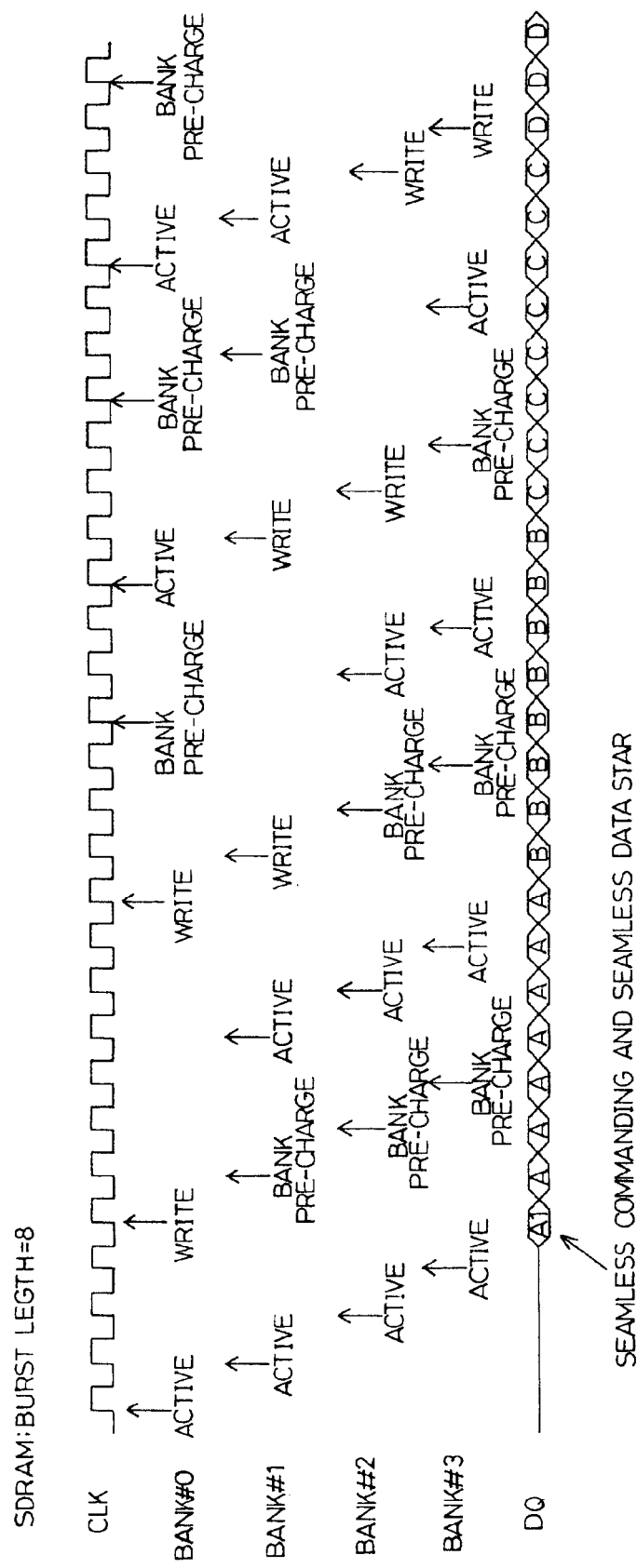

| TRANSACTION A: | a0={Da,Ba,Ra0} | a1={Da,Ba,Ca1} | a2={Da,Ba,Ca2} | a3={Da,Ba,Ca3} | a4={Da,Ba,Ca4} |
|---|---|---|---|---|---|
| TRANSACTION B: | b0={Db,Bb,Rb0} | b1={Db,Bb,Cb1} | b2={Db,Bb,Cb2} | b3={Db,Bb,Cb3} | b4={Db,Bb,Cb4} |
| TRANSACTION C: | c0={Dc,Bc,Rc0} | c1={Dc,Bc,Cc1} | c2={Dc,Bc,Cc2} | c3={Dc,Bc,Cc3} | c4={Dc,Bc,Cc4} |
| TRANSACTION D: | d0={Dd,Bd,Rd0} | d1={Dd,Bd,Cd1} | d2={Dd,Bd,Cd2} | d3={Dd,Bd,Cd3} | d4={Dd,Bd,Cd4} |
| TRANSACTION E: | e0={De,Be,Re0} | e1={De,Be,Ce1} | e2={De,Be,Ce2} | e3={De,Be,Ce3} | e4={De,Be,Ce4} |

RDRAM: TRR=8 TCYCLE; TCAC=8 TCYCLE; TRAS=20 TCYCLE; TRDP=4 TCYCLE;

FIG.4B

METHOD FOR TESTING MEMORIES WITH SEAMLESS DATA INPUT/OUTPUT BY INTERLEAVING SEAMLESS BANK COMMANDS

BACKGROUND OF THE INVENTION

1. Field of the Invention

The present invention relates to a method for testing memories, and more particularly to a method for testing memories with seamless data input/output by interleaving seamless bank commands so as to detect a weakened memory.

2. Description of Related Art

While dynamic random access memories (DRAM) are manufactured by 0.2 μm process technology or an advanced manufacturing process, a power supply is lower than 3.3 volts, and a clock rate applied is higher than 133 megahertz, and the DRAM performance is then more and more sensitive to noise from external command signals, address signals, input data signals, and intrinsic noise raised from internal circuitry. For such consideration, DRAM designers have to carefully design memory circuits to provide correct data storage/access paths from each memory cell. On the other hand, DRAM manufacturing engineers must carefully control process conditions to guarantee target device/circuit performance. Even so, weakened memory cells still sometimes exist in DRAM chips and weakened data are probably stored. Thus, a challenge to test engineers is to provide a testing program to screen those memories and assist circuit designers to find critical data access paths and to cover device weakness.

A memory testing program is assembled by a pin condition setting, and a data access pattern. The pin condition setting includes setting of commanding pins, addressing pins and I/O pins. The data access pattern is used to define word-by-word data access paths and its corresponding operational clock rate. The pin condition setting, which includes true table setting and logic high/low voltage setting, is based on DRAM specification reference to data sheet. The data access pattern is, on the other hand, created by specific testing purposes. For instance, a one-dimensional row access pattern for accessing memory cells on a fixed word line (W/L) is applied to check word line continuity; and a one-dimensional column access pattern for accessing memory cells located on the same column is applied to check bit line (B/L) continuity. In the book "Testing Semiconductor Memory" written by A. J. van de Goor, published by John Wiley & Sons, there are traditional two-dimensional checkboards, GALPAT, sliding diagonals, butterfly patterns etc. for providing better fault coverage.

Usually, programming commands loops are used to carry out the access patterns mentioned above. For example, a memory has four banks (#0~#3) are shown in FIGS. 5, 6A and 6B, a programmable cycling control command "Bank active—Write or Read—Bank pre-charge" is applied in the single bank (Bank #0), wherein the burst length in FIGS. 5, 6A and 6B is 4. In FIG. 5, while a "write" command is generated, data having four clock lengths are outputted from data input/output terminals (DQ). In FIGS. 6A and 6B, while a "read" command is generated, data in DQ respectively has two and three clock latency. This kind of cycling command is generally used to check basic functions of DRAM chips, however data in DQ are not inputted/outputted seamlessly.

With reference to FIGS. 7, 8A and 8B, those figures are similar to FIGS. 5, 6A and 6B, with a difference being that a programmable cycling command "Bank active—Write with auto pre-charge or Read with auto pre-charge" is applied in a single bank (Bank #0). This kind of loop is used to check functions of an auto pre-charge.

With reference to FIGS. 9 to 12, those figures disclose an interleave bank operation. Two banks interleave and four banks interleave operations are shown in FIGS. 9~10 and FIGS. 11~12 respectively Such repeated operations are capable to do seamless input/output (I/O) checks for examining I/O performance. Clearly, the operations shown in FIGS. 9 to 12 suffer larger noise due to more compact I/O operations than those shown in FIGS. 5 to 8. Although DQ in FIGS. 9 to 12 are inputted/outputted data seamlessly, control pins of memory still do not receive seamless controlling commands. Even four banks (Bank #0, #1, #2 and #3) receive initial "active" commands, the control pins still retain in a "wait" situation at 14th, 15th, 18th, 19th, 22nd, 23rd, 26th, 27th, clock cycles. Thus the commands shown in FIGS. 9 to 12 are not sufficient to detect weakened memory cells.

To overcome these shortcomings, the present invention tends to provide a method for testing a memory with seamless data input/output by interleaving seamless bank commands to mitigate and obviate the aforementioned problems.

SUMMARY OF THE INVENTION

The main object of the present invention is to provide a method for testing memories with seamless data input/output by interleaving seamless bank commands so as to provide seamless data and commands to data input/output pins and control pins of the memory.

The second object of the present invention is not only to provide a method that suits testing SDRAMs, but also suits testing DDR DRAMs and RDRAMs.

To achieve the main object, the method in accordance with the present invention comprising steps of:

transferring data to data input/output (I/O) pins of memories seamlessly;

inputting control commands to control pins of the memories seamlessly.

Thus control pins and data input/output pins of memories receive heavy loading due to the seamless control commands, whereby the weakened memories are easily to detect.

Other objects, advantages, and novel features of the invention will become more apparent from the following detailed description when taken in conjunction with the attached drawings.

BRIEF DESCRIPTION OF THE DRAWINGS

FIGS. 1A to 1C respectively show a memory testing timing sequence view of first to third embodiments in accordance with the present invention;

FIGS. 4A and 4B respectively show a RDRAM memory testing timing sequence view in accordance with the present invention;

DETAILED DESCRIPTION OF THE PREFERRED EMBODIMENT

The present invention is a method for testing a memory by providing seamless control commands and data, wherein the memory has at least two banks. By providing seamless control commands and data, the control pins and data input/output pins of the memory receive heavy loading due to the seamless control commands. For SDRAMs and DDR-DRAMs, control commands and data are seamlessly inputted/outputted at each clock cycle. For RDRAMs, control commands are inputted at each "command packet", whereby data are inputted/outputted at each "data packet" and memories are in heavy loading status. By providing heavy loading to memories, it is easy to detect weakened memories.

In the following description, "DQ" that appears in figures in accordance with the present invention is used to represent data input/output terminals.

Figure 1A:
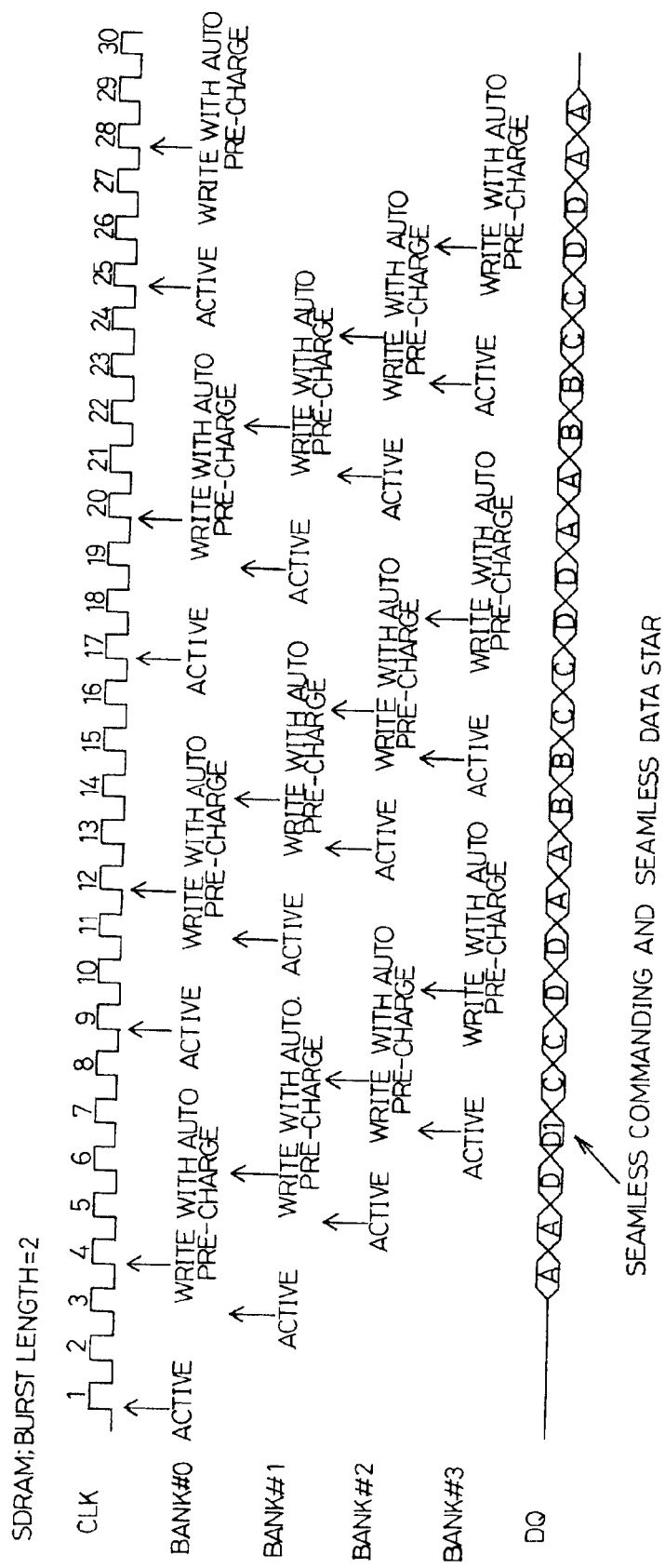
Figure 1B:
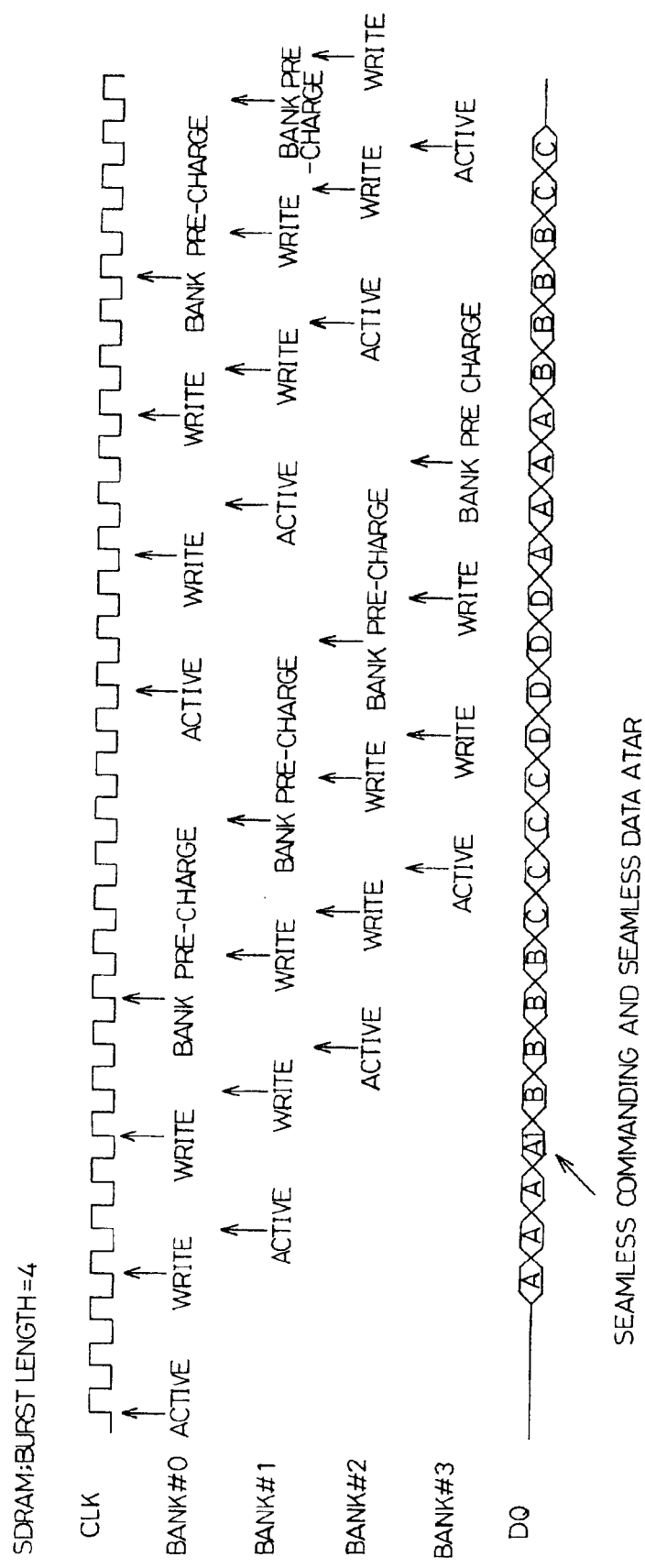

With reference to FIGS. 1A, 1B and 1C, timing sequence views respectively having burst lengths of 2, 4 and 8 with different cycling control commands are shown.

With reference to FIG. 1A, after banks #0~#3 serially receive "active" commands with two clock cycle intervals, control commands "write with auto pre-charge" are inputted to each bank at appropriate intervals. Thus after the bank #3 receives the initial "active" command, control commands (including "active" and "write with auto-pre charge") are sequentially inputted to the banks #0~#3 at each clock cycle, whereby data input/output terminals (DQ) have seamless data input/output and remains in a heavy loading status.

With reference to FIG. 1B, the burst length is 4 and the cycling control commands are programmed as "active, write, write, bank pre-charge", and the data input/output terminals (DQ) still have seamless data input/output.

With reference to FIG. 1C, the burst length is 8. Different types of cycling control commands are provided to each bank. In the bank #0, the control commands are "active, write, write, bank pre-charge, active, bank pre-charge, active, bank precharge". In the bank #1, the control commands are "active, bank pre-charge, active, write, write, bank pre-charge, active". In the bank #2, the control commands are "active, bank pre-charge, active, bank pre-charge, active, write, write". In the bank #3, the control commands is another type that differs from the control commands in banks #0~#2. Although the control commands types for each bank are different, control pins and data input/output terminal (DQ) still remain in a heavy loading status.

Figure 2A:
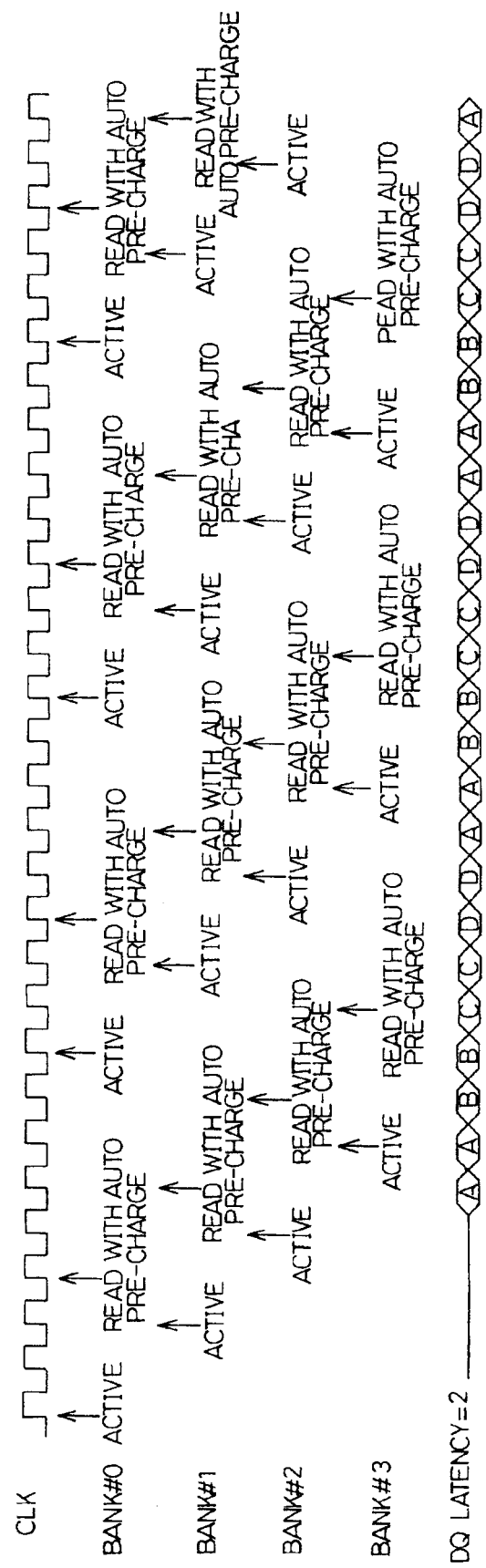
FIGS. 2A to 2D respectively show a memory testing timing sequence view of fourth to seventh embodiments in accordance with the present invention.
Figure 2B:
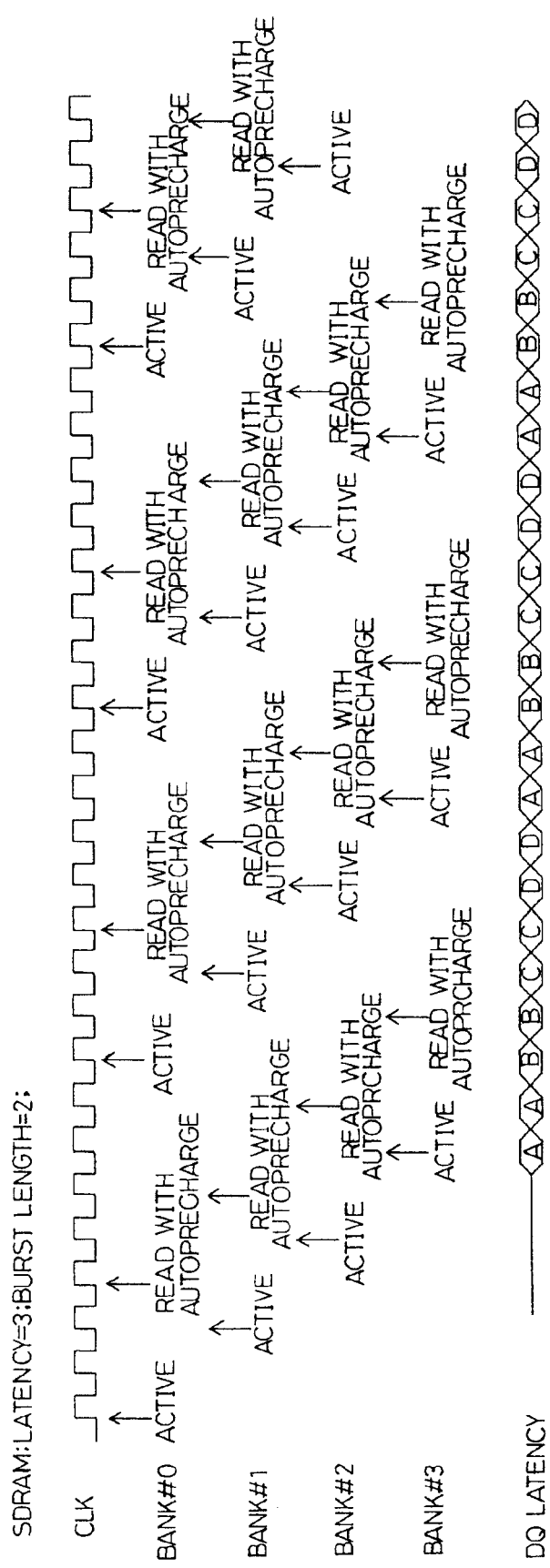

With reference to FIGS. 2A and 2B, cycling control commands "active, bank with auto pre-charge" are applied to each bank with different latencies(2 and 3). At each clock cycle, one of the banks (bank #0~#3) still receives a control command, and the data input/output terminals (DQ) has seamless data input/output.

The present invention not only provides seamless data and control commands to data input/output terminals (DQ) and control pins, but also depends on memory testing requirement to provide a purposeful interrupt or delay to control commands.

Figure 2C:
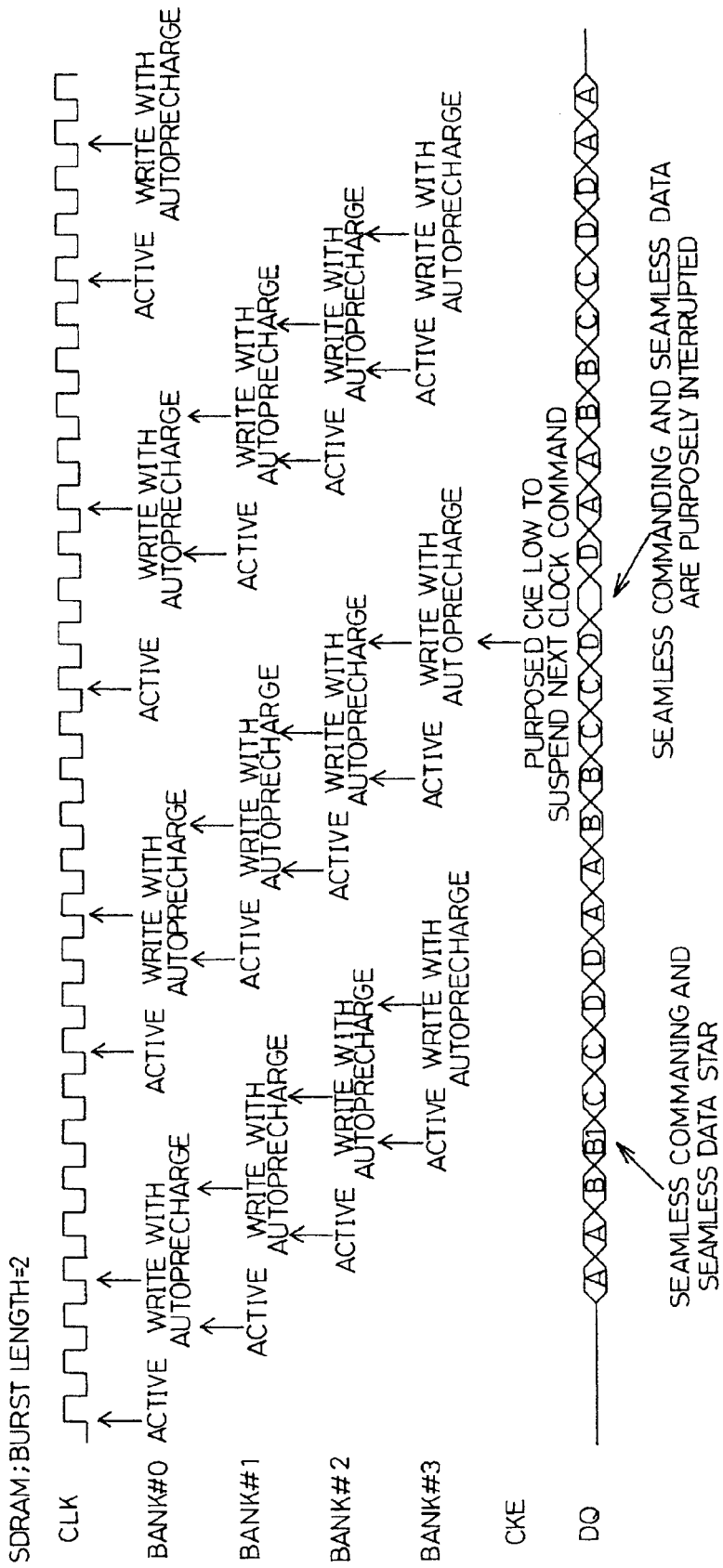

With reference to FIG. 2C, a control command "CKE" is inserted in the cycling control commands, thus the next control command has a one clock cycle delay, whereby the operating accuracy of memories is easily detected.

Figure 2D:
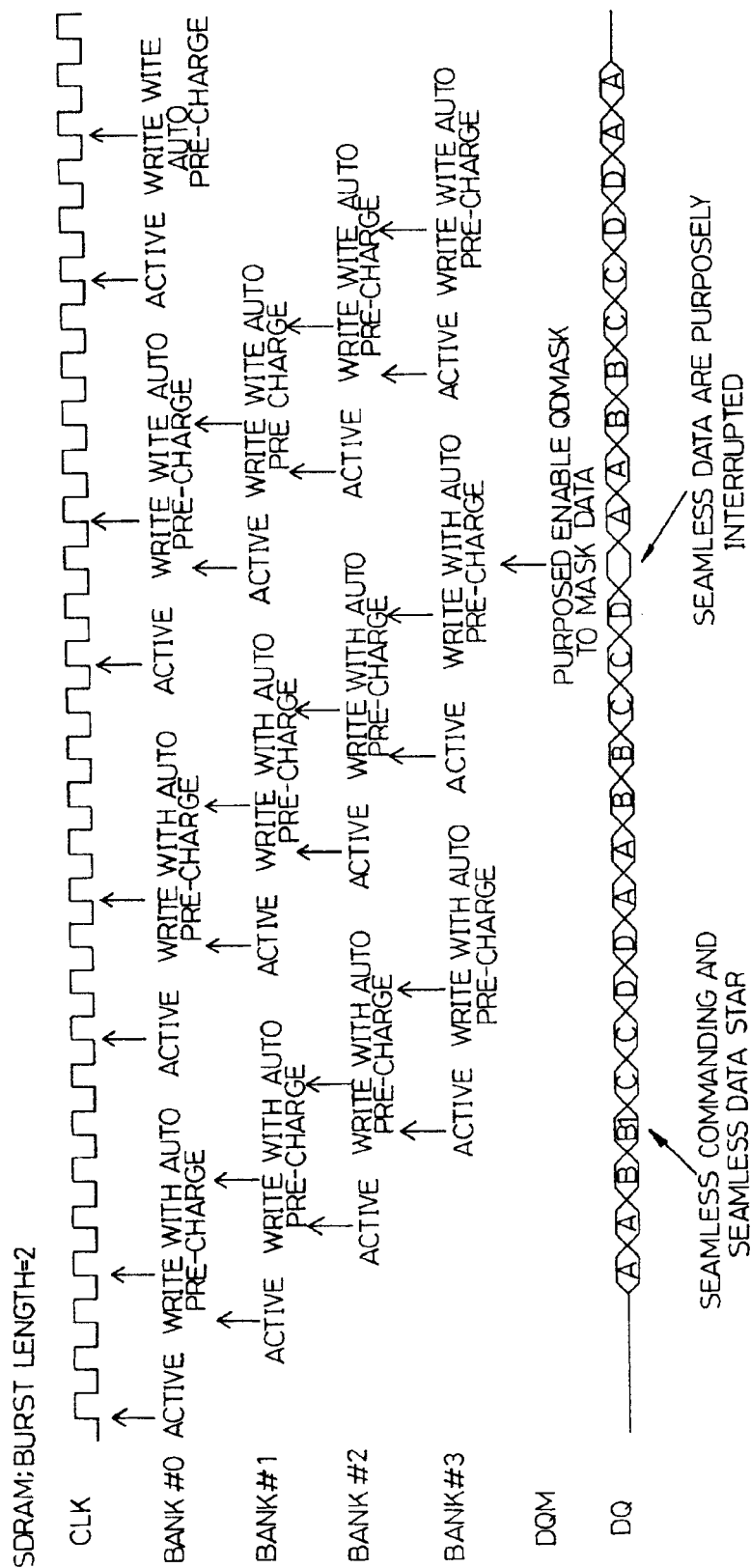

With reference to FIG. 2D, a mask control command "DQM" is inserted in the cycling control commands at a purposeful clock cycle, thus data at the purposeful clock cycle are masked.

The present invention also suits application for DDR-DRAMs and RDRAMs.

Figure 3A:
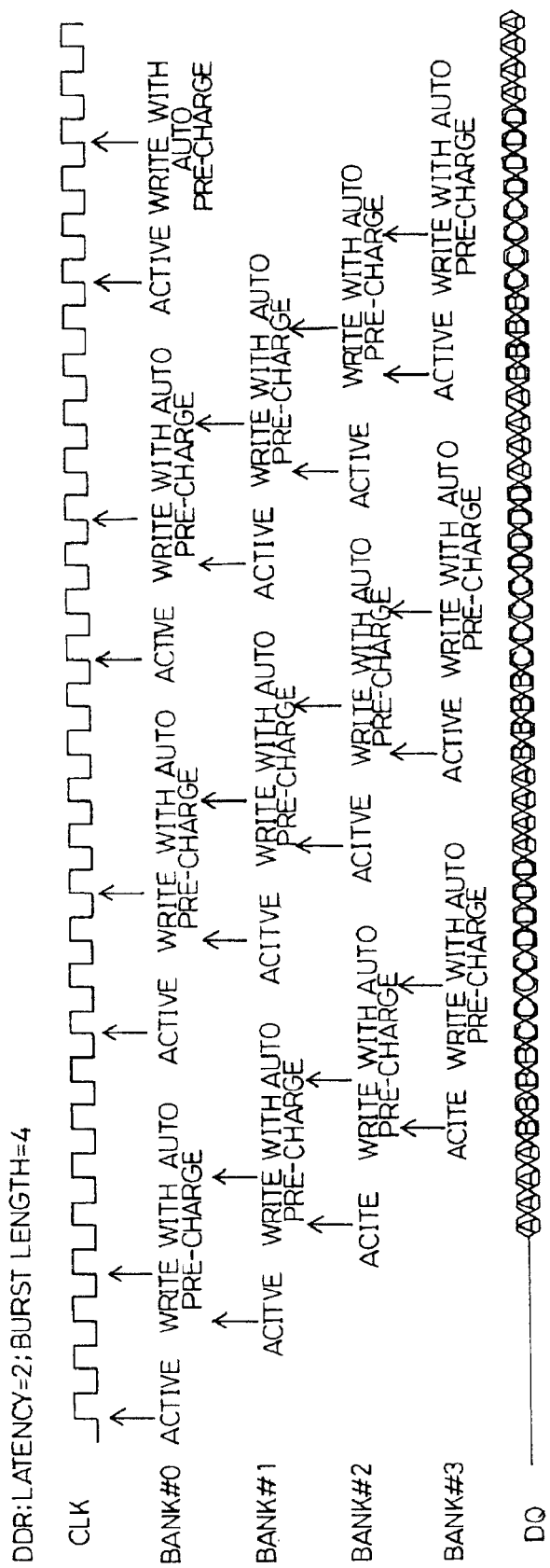
FIGS. 3A to 3C respectively show a DDR-DRAM memory testing timing sequence view in accordance with the present invention.
Figure 3B:
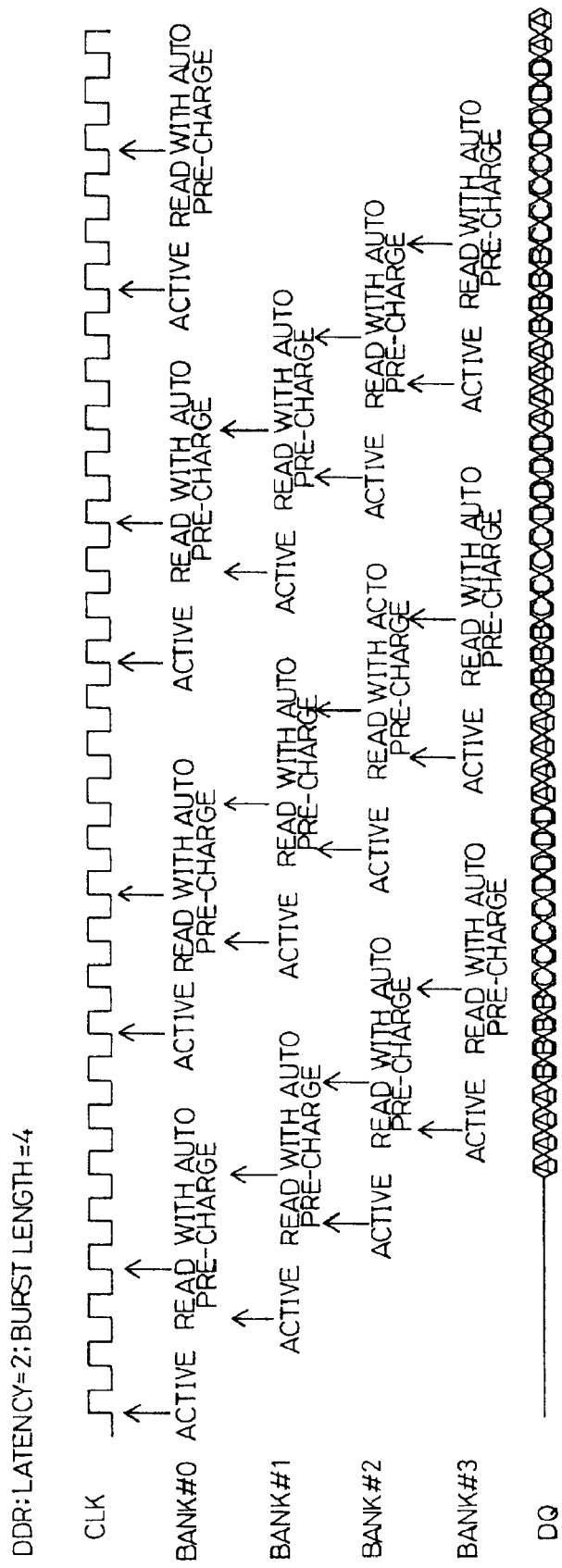
Figure 3C:
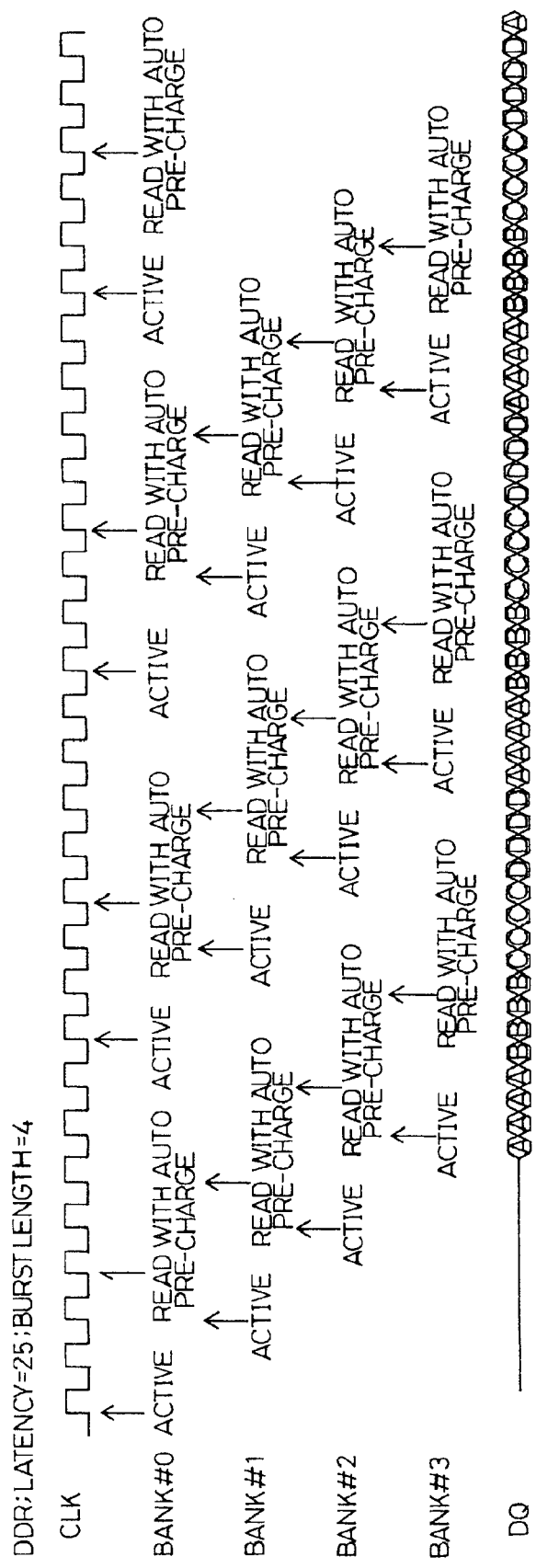

With reference to FIGS. 3A, 3B and 3D, timing sequence views of testing DDR-DRAMs with data writing/reading are respectively shown. The cycling control commands of DDR-DRAMs are similar to the control commands mentioned above. The difference between the data inputting/outputting status of FIGS. 3A, B and D, and the data inputting/outputting status mentioned above is that two data appear at the same clock cycle.

Figure 4A:
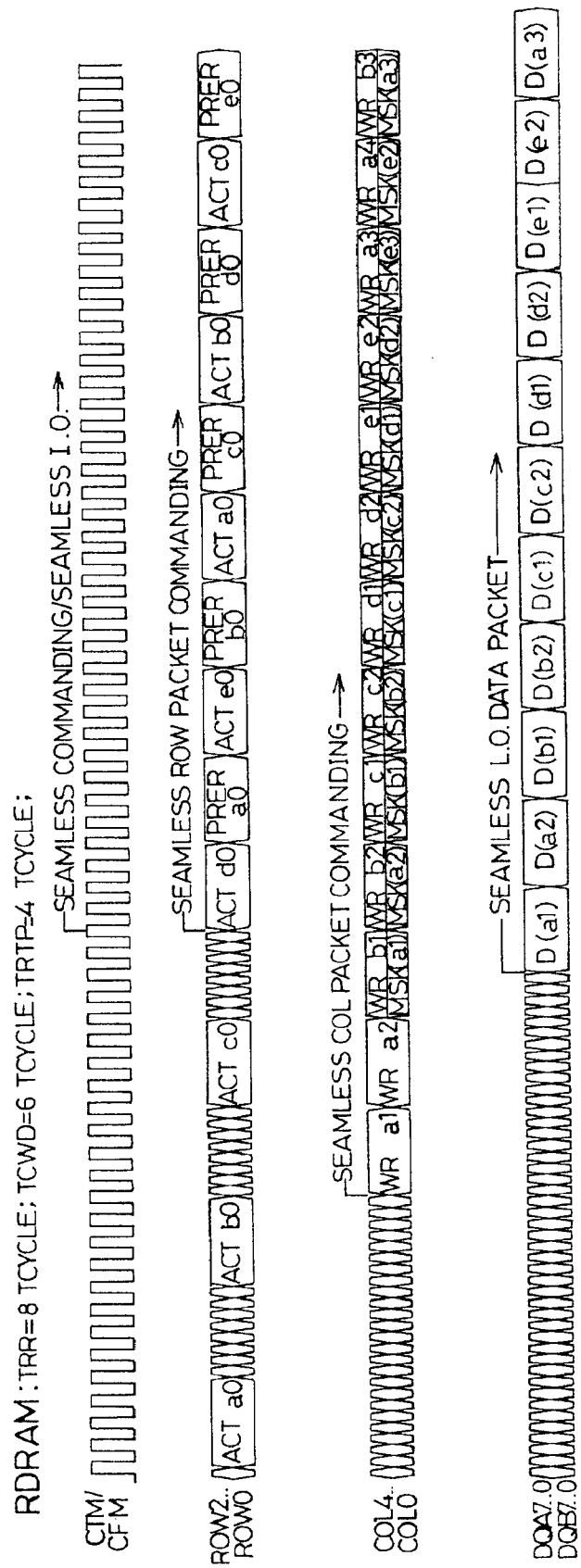
Figure 5:
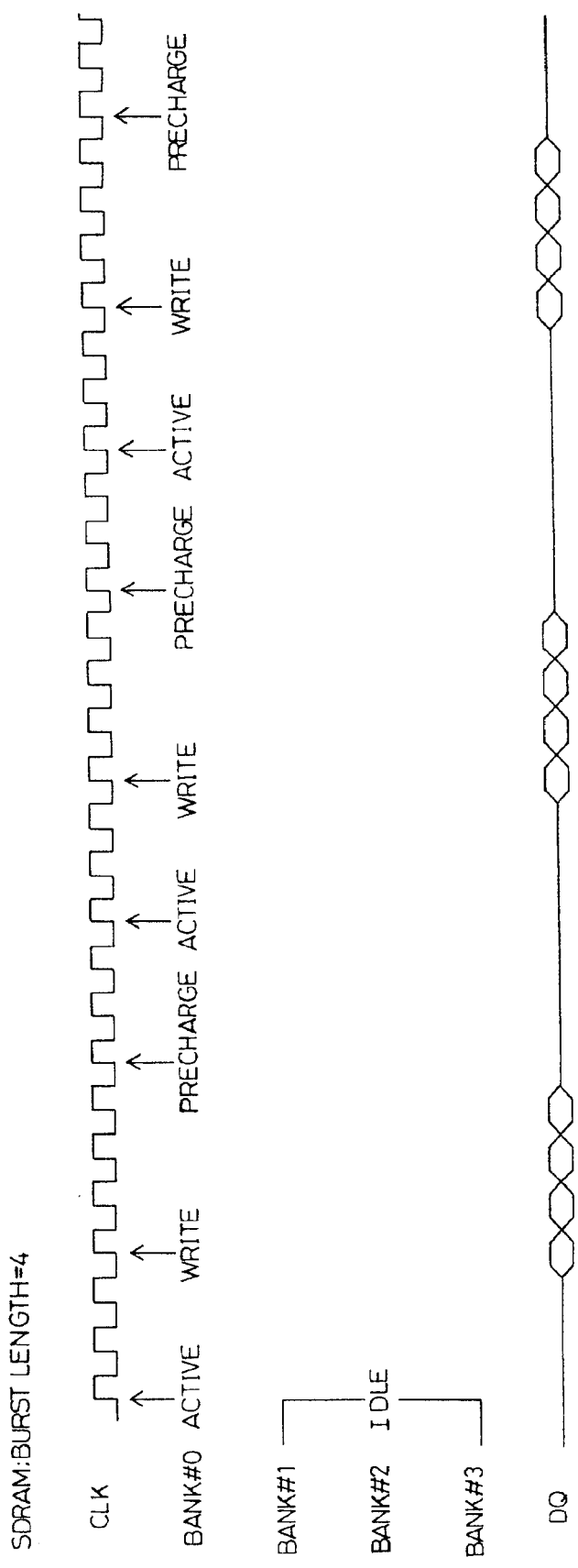
FIG. 5 is a timing sequence view of a conventional memory testing method showing data writing in a single bank.
Figure 6A:
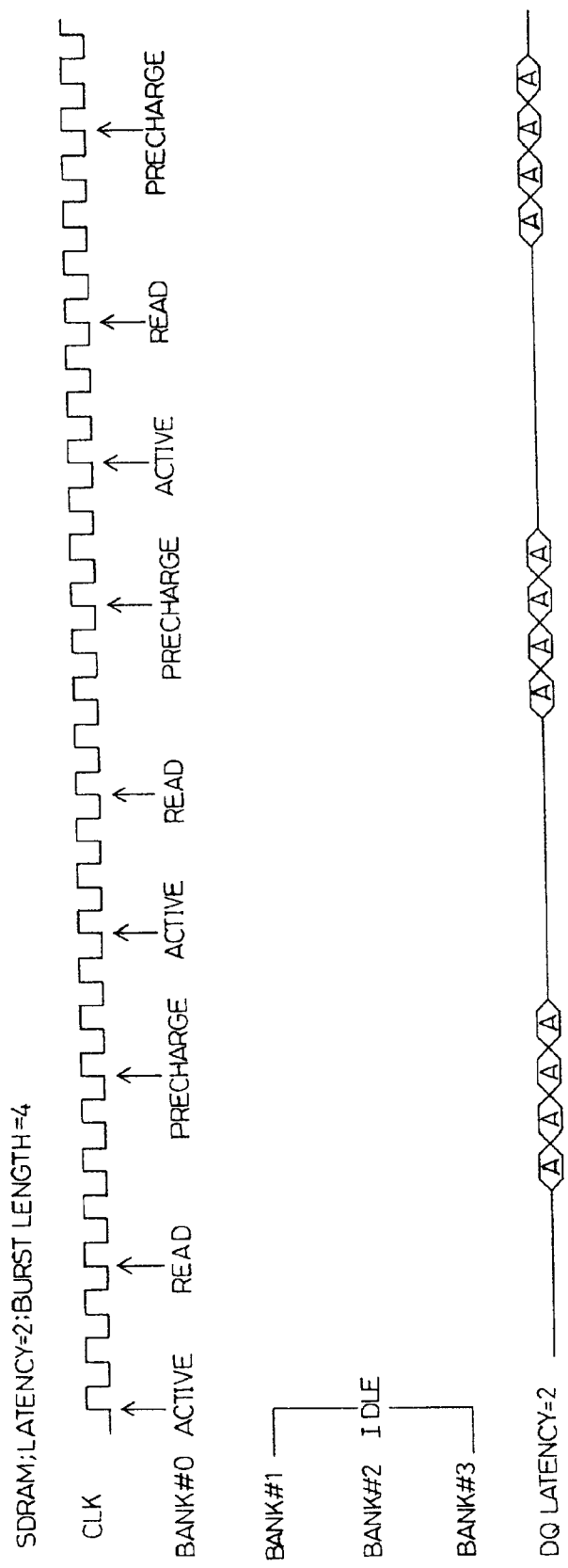
FIGS. 6A and 6B are timing sequence views of a conventional memory testing method showing data reading in a single bank.
Figure 6B:
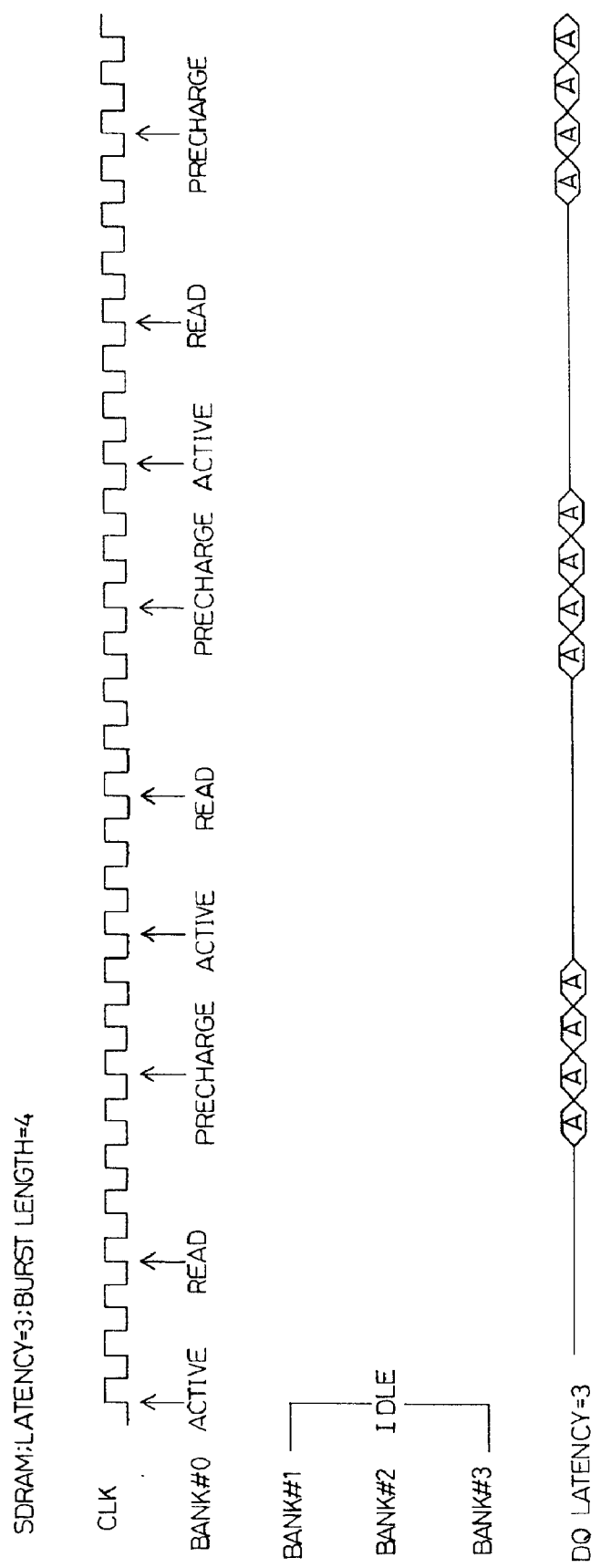
Figure 7:
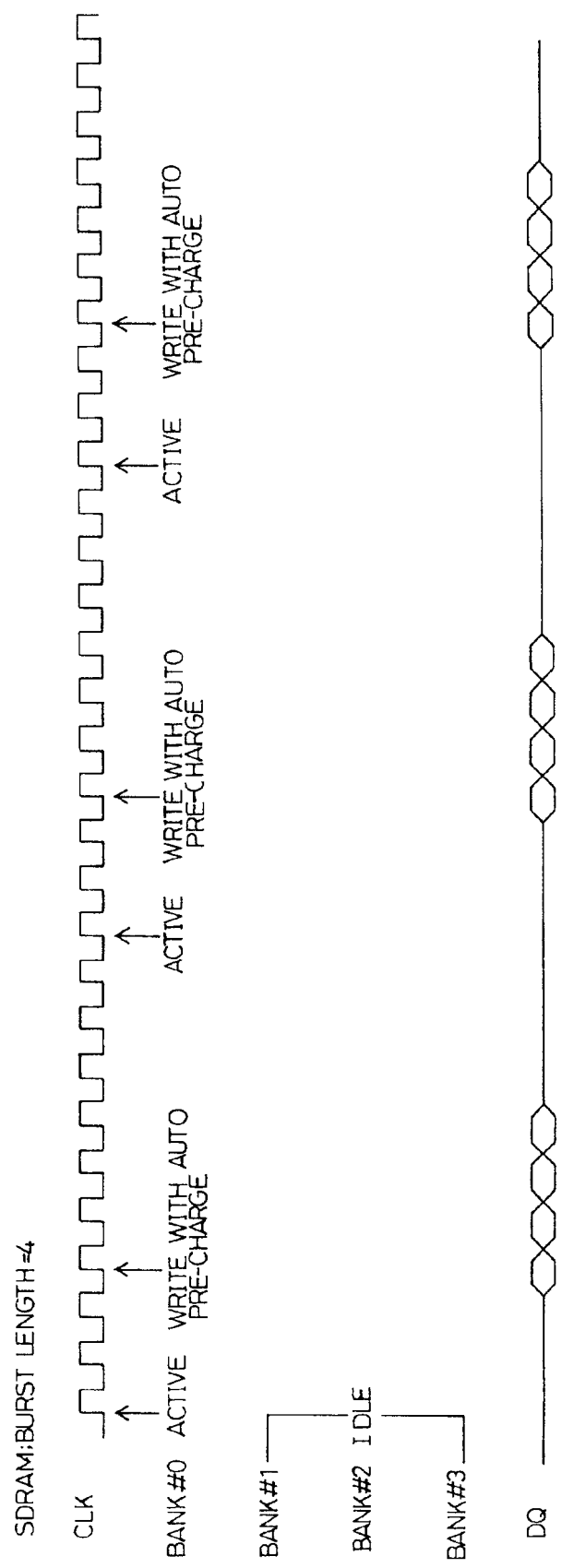
FIG. 7 is a timing sequence view of a conventional memory testing method showing data writing and auto pre-charge in a single bank.
Figure 8A:
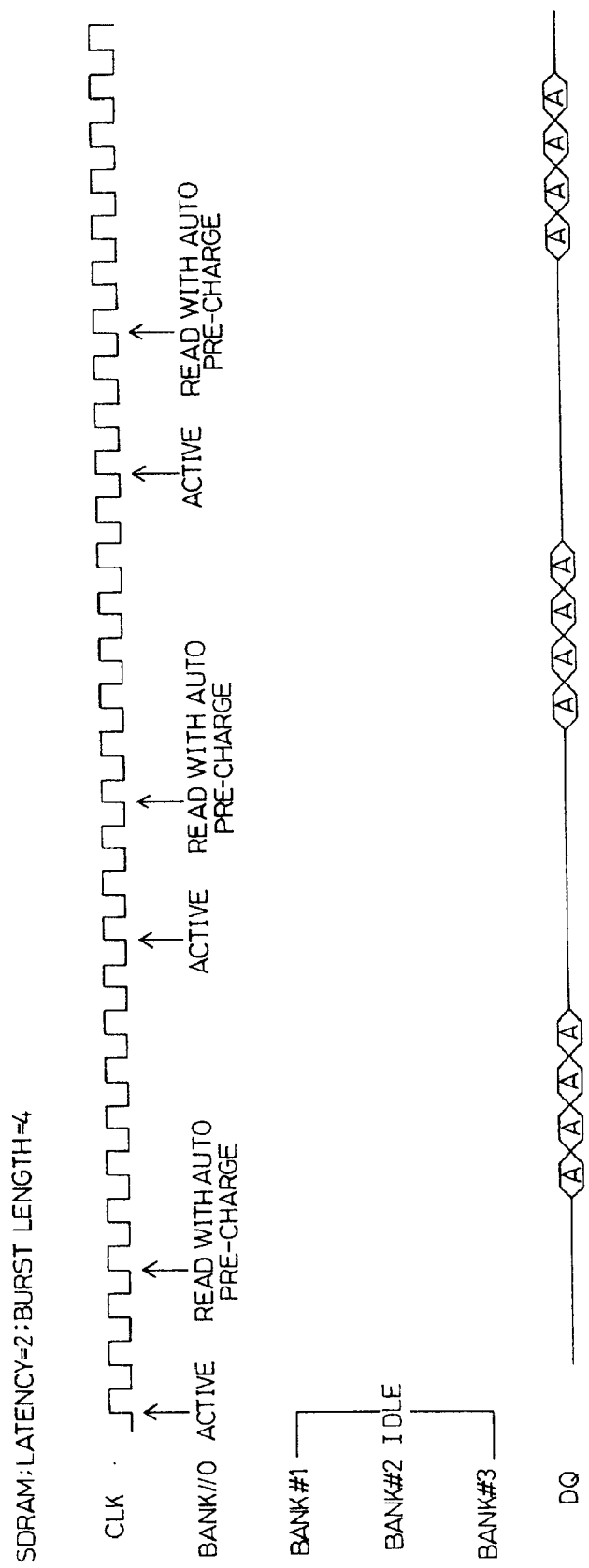
FIGS. 8A and 8B are timing sequence views of a conventional memory testing method showing data reading and auto pre-charge in a single bank.
Figure 8B:
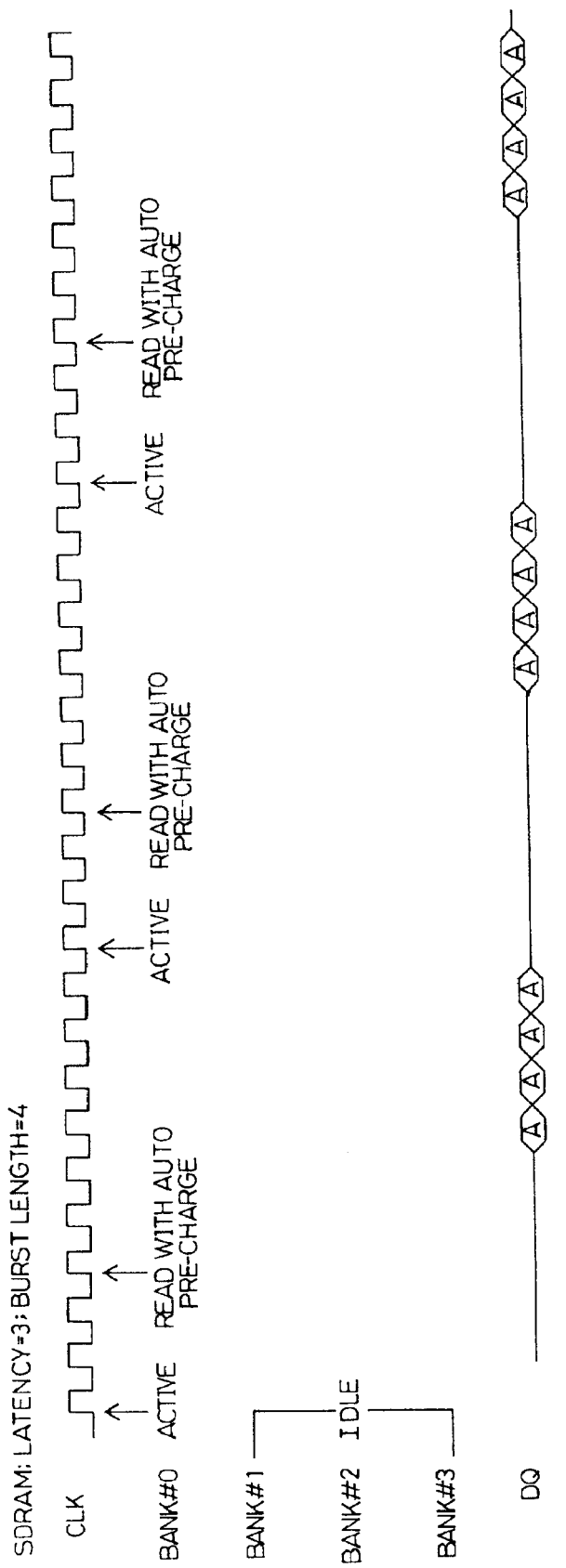
Figure 9:
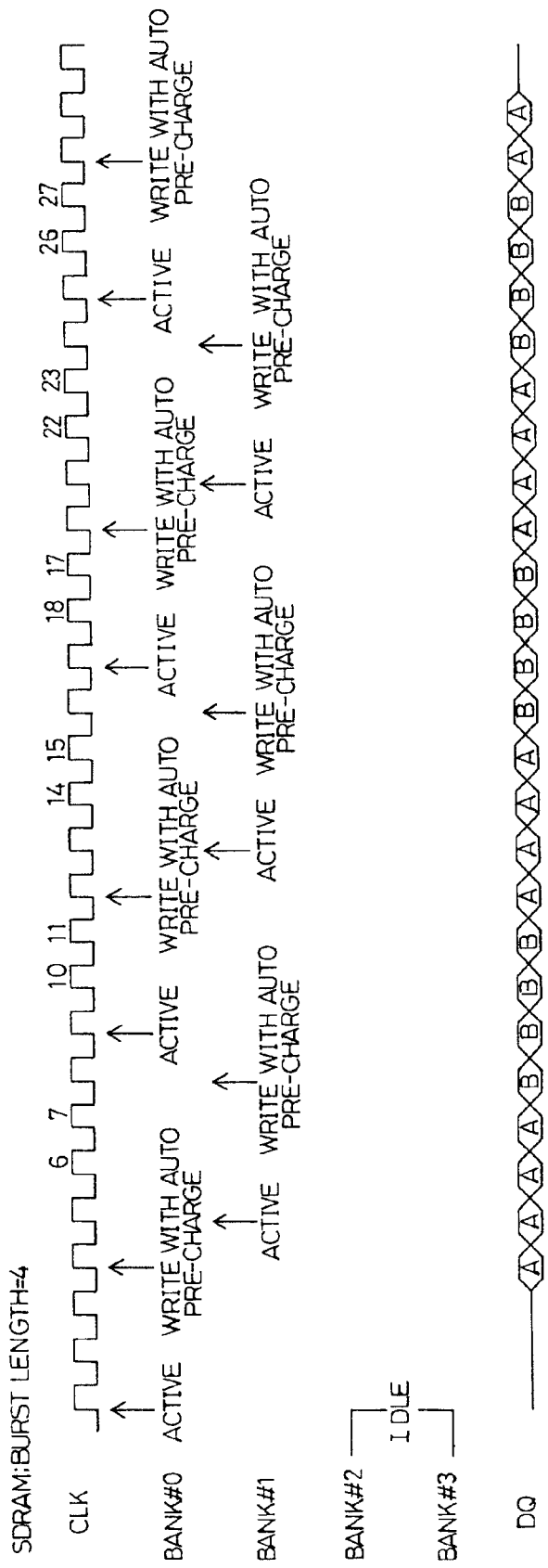
FIGS. 9, 10A, 10B, 11, 12A and 12B are timing sequence views of a conventional memory testing method showing data reading/writing in multi-banks.
Figure 10A:
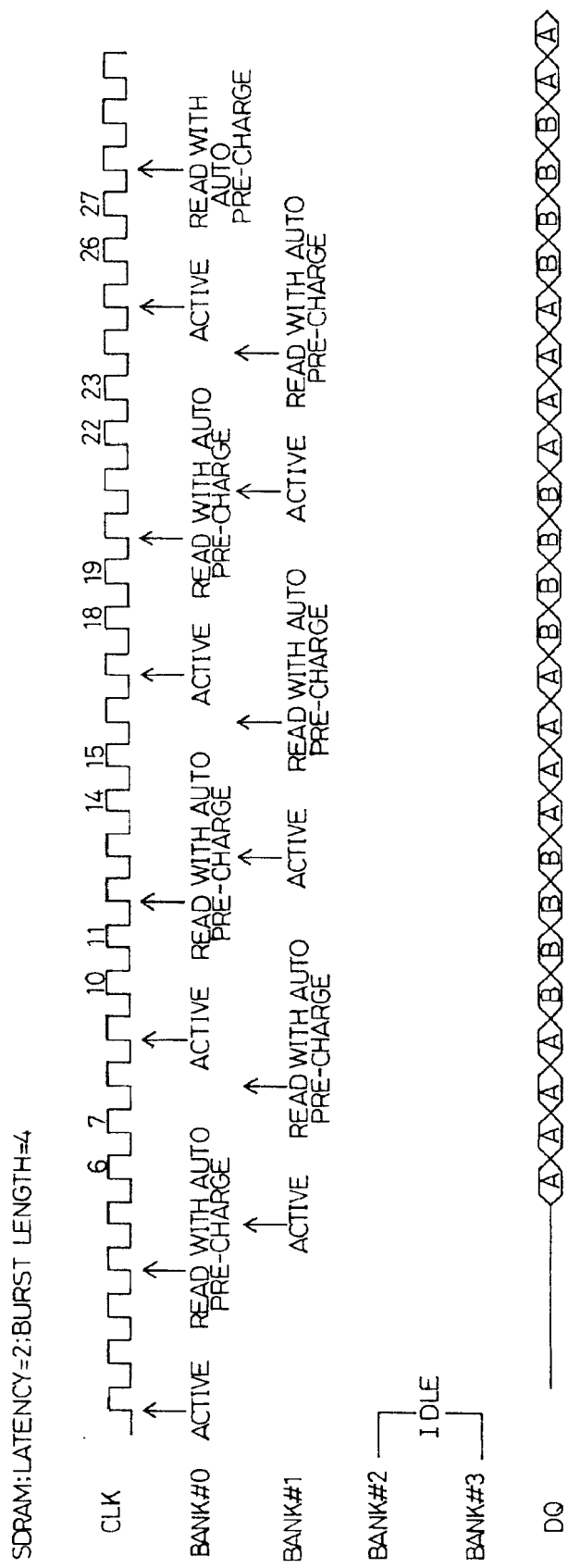
Figure 10B:
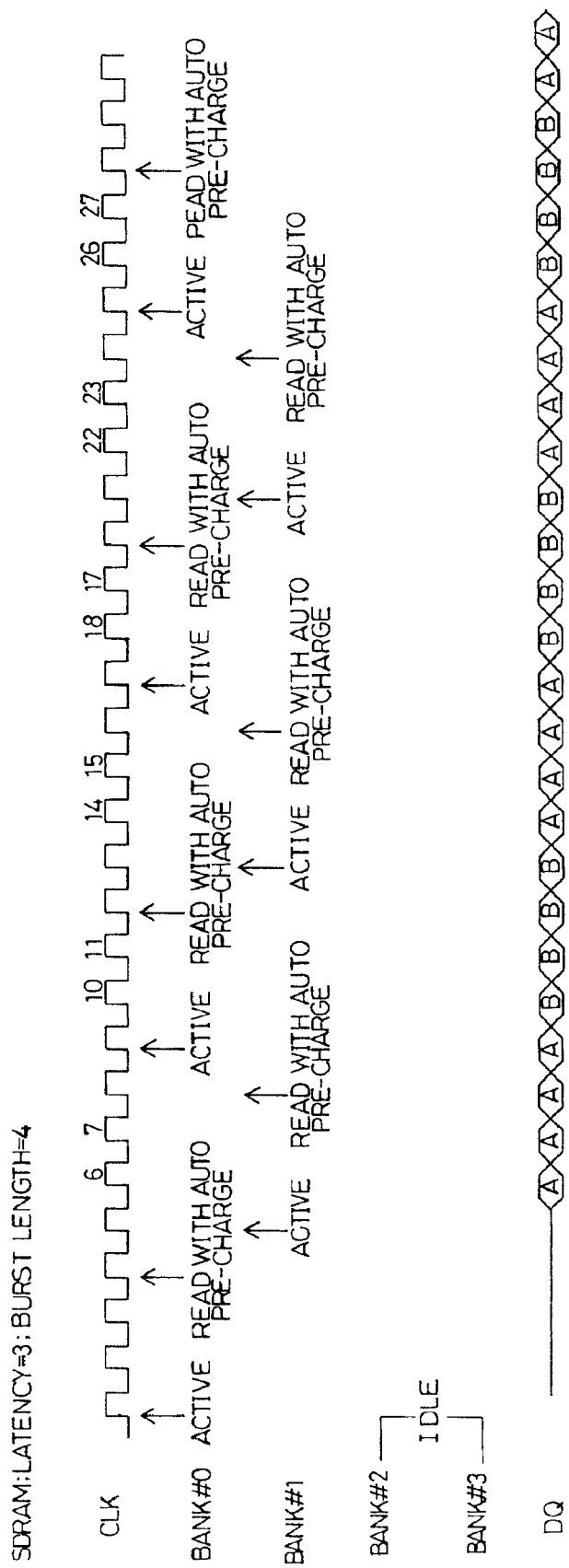
Figure 11:
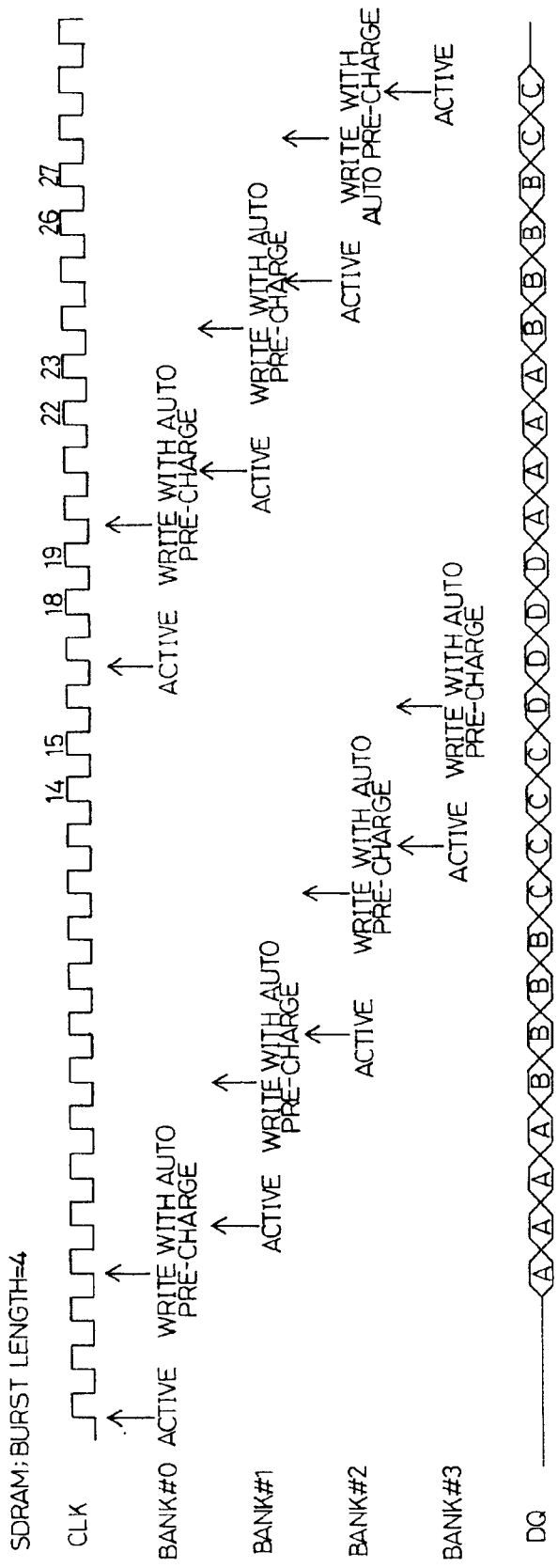
Figure 12A:
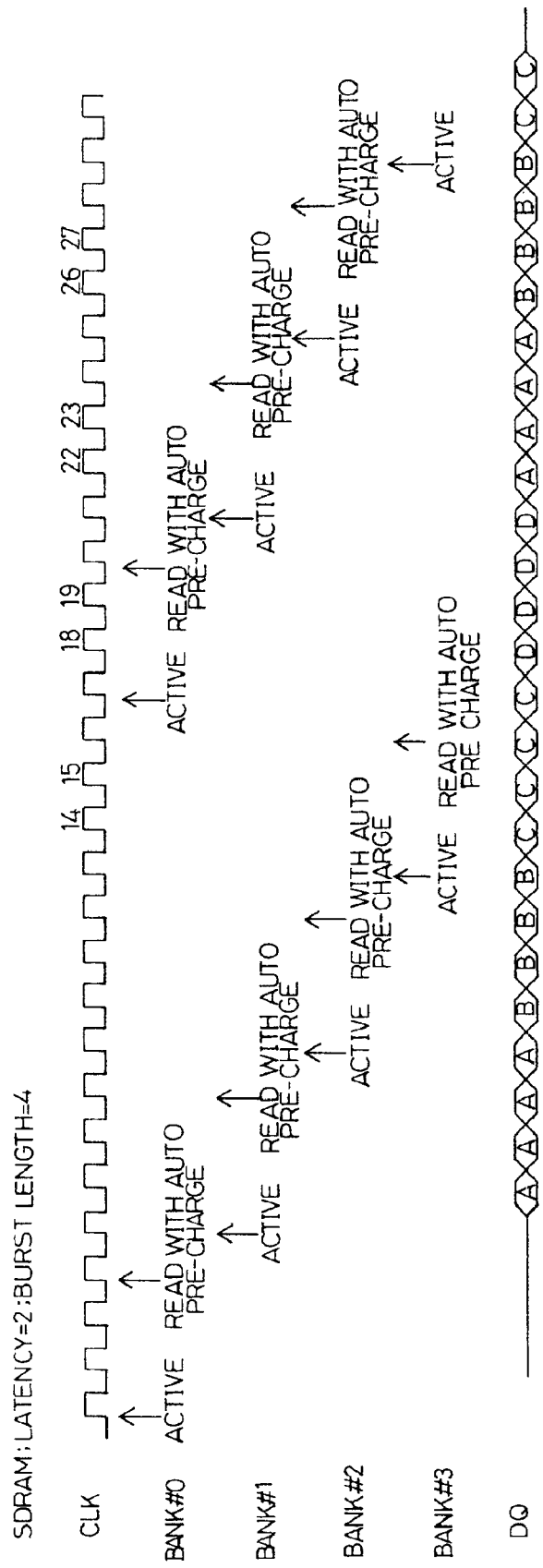
Figure 12B:
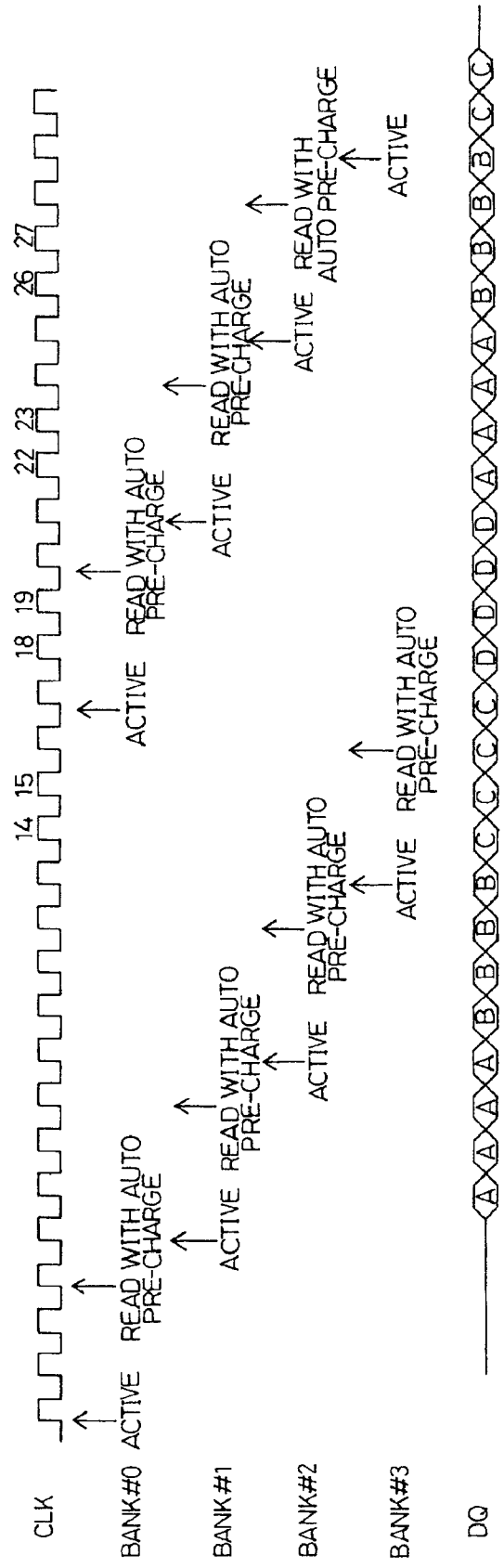

With reference to FIGS. 4A, 4B and 4C, timing sequence views of testing RDRAMs with data writing/reading are respectively shown, wherein control commands and data are inputted/outputted seamlessly at each "packet" not "clock cycle".

Although the present invention has been explained in relation to its preferred embodiment, it is to be understood that many other possible modifications and variations can be made without departing from the spirit and scope of the invention as hereinafter claimed.

What is claimed is:

1. A method for testing memories with seamless data input/output by interleaving seamless bank commands, comprising the steps of:

transferring data to data input/output (I/O) pins of a memory seamlessly; and inputting control commands to control pins of the memory seamlessly.

2. The method as claimed in claim 1, wherein in the data transferring step, the data are seamlessly inputted to and outputted from the input/output (I/O) pins of the memory.

3. The method as claimed in claim 1, wherein in the data transferring step, the data are seamlessly inputted to the input/output (I/O) pins of the memory.

4. The method as claimed in claim 1, wherein in the data transferring step, the data are seamlessly outputted from the input/output (I/O) pins of the memory.

5. The method as claimed in claim 1, wherein the memory has at least two banks that have the control pins for receiving the control commands.

6. The method as claimed in claim 1, wherein the memory is a SDRAM, DDR-DRAM or Rambus RDRAM.

* * * * *